United States Patent [19]
Horii

[11] Patent Number: 5,966,015
[45] Date of Patent: Oct. 12, 1999

[54] TEST FIXTURE FOR CIRCUIT COMPONENT

[75] Inventor: Ryogo Horii, Hyogo, Japan

[73] Assignee: Hewlett Packard Company, Palo Alto, Calif.

[21] Appl. No.: 08/891,565

[22] Filed: Jul. 11, 1997

[30] Foreign Application Priority Data

Jul. 26, 1996 [JP] Japan ................................ 8-197201

[51] Int. Cl.$^6$ ...................................................... G01R 1/06
[52] U.S. Cl. ......................... 324/500; 324/158.1; 324/519
[58] Field of Search ................................. 324/500, 519, 324/537, 158.1; 307/149

[56] References Cited

U.S. PATENT DOCUMENTS

| | | | |
|---|---|---|---|
| 3,609,547 | 9/1971 | Slusser | 324/760 |
| 3,763,430 | 10/1973 | Terrey | 324/537 |
| 4,145,620 | 3/1979 | Dice | 324/501 |
| 4,447,782 | 5/1984 | Rutkoski | 324/56 |
| 4,567,432 | 1/1986 | Buol et al. | 324/754 |
| 4,782,289 | 11/1988 | Schwar et al. | 324/754 |

*Primary Examiner*—Josie Ballato
*Assistant Examiner*—Jermele M. Hollington

[57] ABSTRACT

Test fixture includes measurement terminals that connect to an oscillator to be tested and contacts that connect to a printed circuit board. The printed circuit board includes a load capacitance circuit with load capacitance contacts and a direct coupling circuit with direct coupling circuit contacts. By changing the direction or orientation of the printed circuit board or reversing its top or bottom surfaces when attaching it to the test fixture, it is possible to switch between a configuration that connects a load capacitance to the oscillator and that directly couples the oscillator to a measurement system.

7 Claims, 4 Drawing Sheets

TEST FIXTURE FOR CIRCUIT COMPONENT

FIELD OF THE INVENTION

The present invention relates to test fixture and more particularly, to test fixture used in measuring the properties of circuit elements such as quartz oscillators.

BACKGROUND OF THE INVENTION

Measurement methods for quartz oscillators can be found in JIS C 6701, "Quartz Oscillators". FIG. 4 of the present application illustrates a circuit design of one such measurement method which includes measurement equipment 30 and test fixture 20. An oscillator 31 to be tested is connected to measurement terminals 26 of the main body of test fixture 20 and, thus, to the main body of a measurement equipment 30, via pi circuits 24 and 25 of test fixture 20. The main body of measurement equipment 30 typically includes impedance measuring equipment or a network analyzer for measuring the properties of connected oscillator 31.

In the case when the properties of oscillator 31 is to be measured with a serially connected load capacitance, the method as illustrated in FIG. 4 is modified. A printed circuit board 40 with an on-board load capacitance 11 is inserted between the main body of test fixture 20 and oscillator 31, as shown in FIG. 5.

FIG. 6 illustrates an overview of the actual components of FIG. 5. Note that FIG. 6 omits design details that are unrelated to the present invention. For more detail, one can refer to JIS C 6701, "Quartz Oscillators", Appendix 2, FIG. 3.

In FIG. 6, test fixture 20 includes connectors 27 for connecting to the main body of measurement equipment 30. A pressure plate 28 utilizes a spring (not shown) to press terminals 32 of oscillator 31 in the direction of connectors 27. The example in FIG. 6 shows both oscillator 31 and a printed circuit board 40 with an on-board load capacitance 11 being pressed toward connectors 27. In order to make contact with terminals 32 of oscillator 31, printed circuit board 40 includes printed contacts 41. The printed contacts for connecting the main body of test fixture 20 with printed circuit board 40 are provided on the back side of printed circuit board 40 (the surface that is not visible in FIG. 6).

As described above, pressure plate 28 is employed to press oscillator 31 and printed circuit board 40 together. Each time a different oscillator is tested, a new pressing operation is required on both printed circuit board 40 and the new oscillator to be tested. Furthermore, for measurement items for which a load capacitance is not required, it is also necessary to remove printed circuit board 40 and directly attach oscillator 31 to the main body of test fixture 20 (i.e., direct coupling). As a result, such an arrangement increases the number of steps for attaching oscillator 31 and printed circuit board 40.

It is also known that there is a method for inserting a load capacitance configuration or a direct coupling configuration in the measurement circuit by opening or closing a switch connected across the load capacitance. This method is found in JIS C 6701, "Quartz Oscillator", Appendix 3, FIG. 1. Although the actual switching operation in this method is simplified, the physical size of the switch has the disadvantage of increasing the size of the main body of the test fixture and the overall cost of the measurement system.

There is a desire to decrease the operational steps for exchanging different oscillators to be tested and for switching between a load capacitance configuration and a direct coupling configuration, without increasing the overall size and cost of the measurement system.

Accordingly, an object of the present invention is to improve the operations for attaching and removing the oscillator to be tested and the printed circuit board.

It is a further object of the present invention to improve the operations for switching between a load capacitance configuration and a direct coupling configuration.

Another object of the invention is to provide the above improvements to the measurement system at a low cost.

SUMMARY OF THE INVENTION

Test fixture includes measurement terminals that connect to an oscillator to be tested and contacts that connect to a printed circuit board. The printed circuit board includes a load capacitance circuit with load capacitance contacts and a direct coupling circuit with direct coupling circuit contacts. By changing the direction or orientation of the printed circuit board or reversing its top or bottom surfaces when attaching it to the test fixture, it is possible to switch between a configuration that connects a load capacitance to the oscillator and a configuration that directly couples the oscillator to the measurement system.

DETAILED DESCRIPTION OF THE INVENTION

Figure 4:
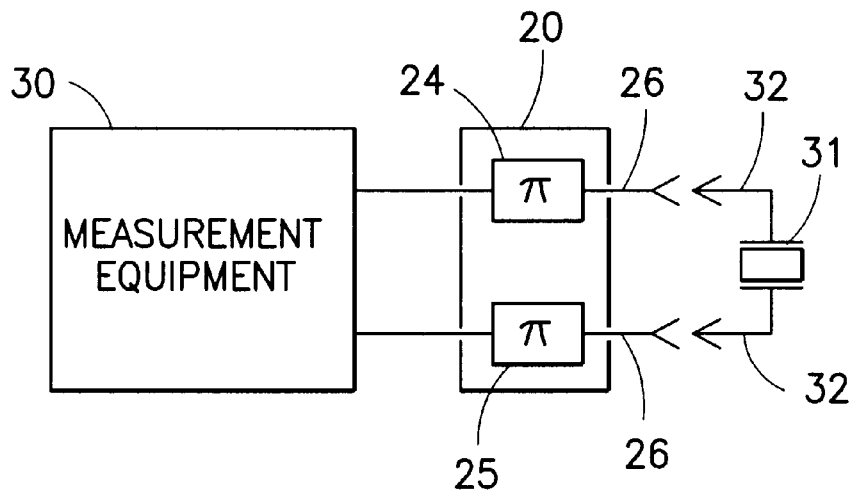
FIG. 4 illustrates an example of a circuit design of the prior art.
Figure 5:
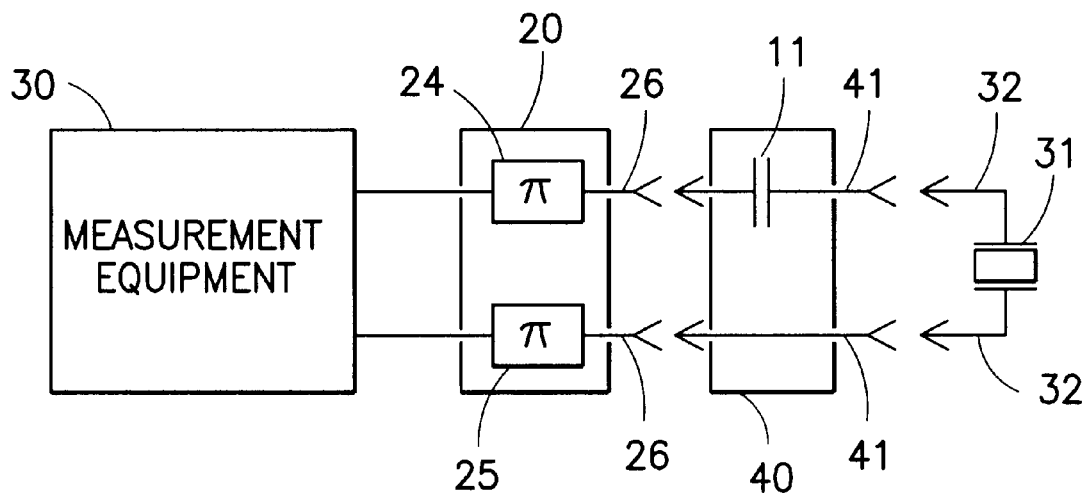
FIG. 5 illustrates an example of a circuit design of prior art.
Figure 6:
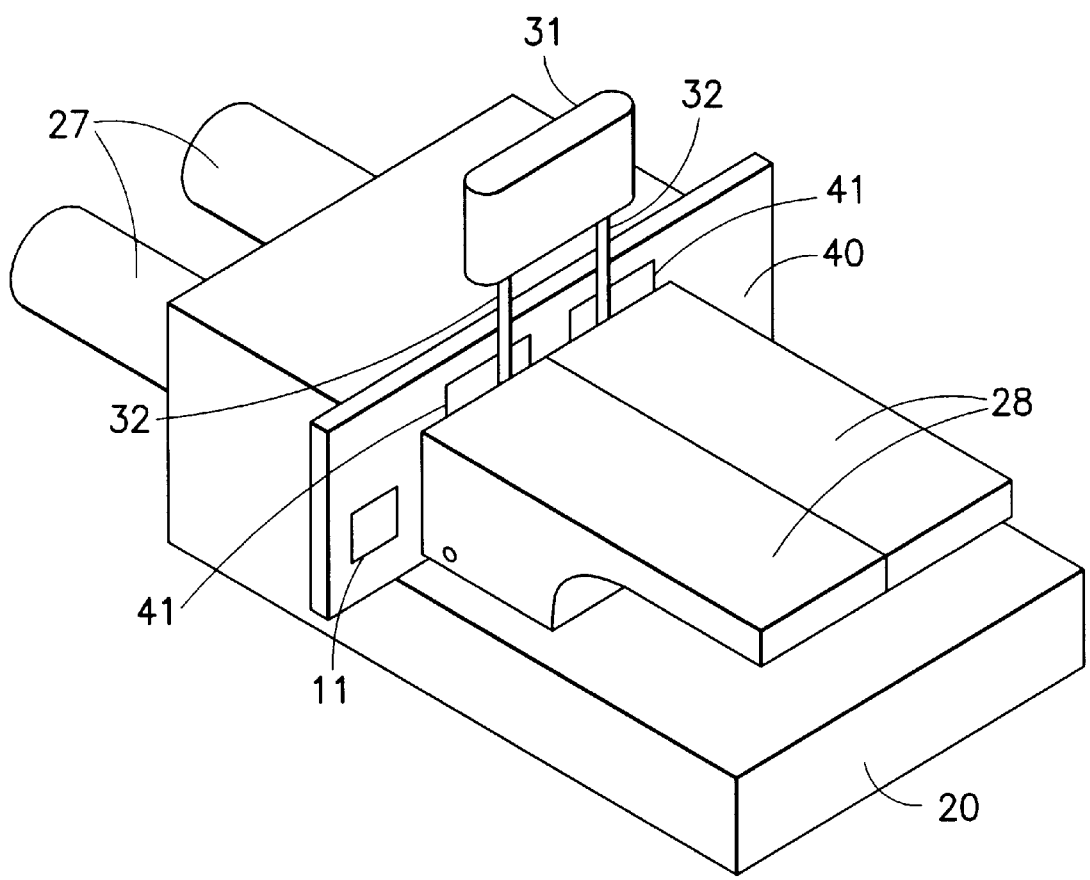
FIG. 6 illustrates an example of test fixture of the prior art.

Before proceeding with a detailed description of the present invention, it is well to know that the same reference numerals will be used to designate circuit components having the same functions as those described in the prior art of FIG. 4.

Figure 2:
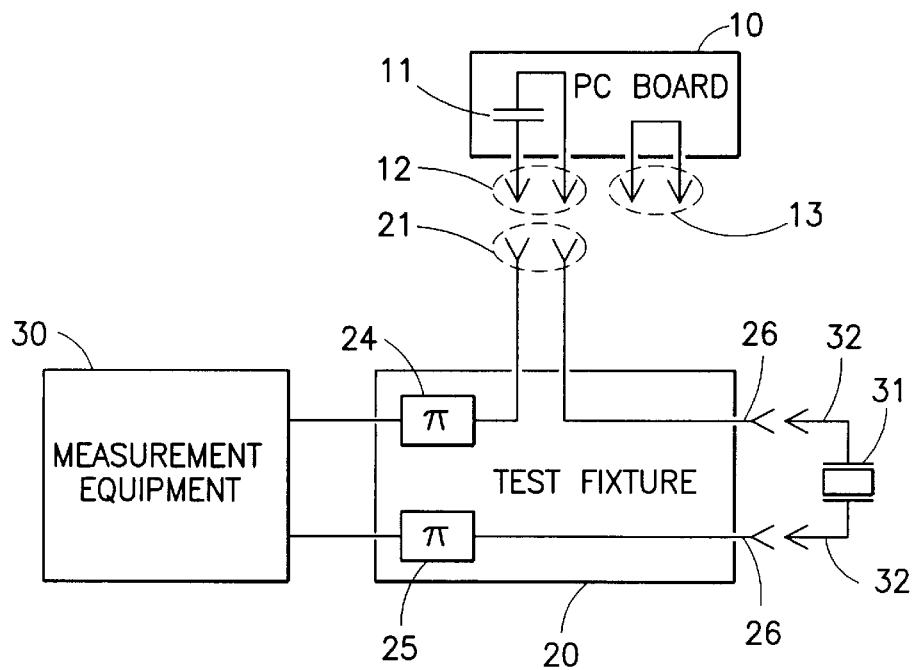
FIG. 2 illustrates a circuit design for the first embodiment of the present invention.

FIG. 2 illustrates a circuit design of a first embodiment of the present invention which includes measurement equipment 30, test fixture 20 and a printed circuit board 10. The main body of test fixture 20 includes contacts 21 for connecting to printed circuit board 10 and measurement terminals 26 for connecting to an oscillator 31 to be tested 31. It is important to understand that contacts 21 are provided separately from measurement terminals 26.

Printed circuit board 10 includes a load capacitance circuit with contacts 12 and a direct coupling circuit (i.e., a short circuit) with contacts 13.

FIG. 2 illustrates the former arrangement wherein load capacitance 11 is inserted into the measurement circuit. When contacts 12 of printed circuit board 10 are coupled respectively to contacts 21 of test fixture 20, load capacitance 11 of printed circuit board 10 is then connected to oscillator 31, via terminals 26. Such an arrangement will hereinafter be referred to as a load capacitance configuration.

In order to convert the above-noted load capacitance configuration to a direct coupling configuration, i.e., without an inserted load capacitance, contacts 13 of printed circuit board 10 (and not contacts 12) are connected respectively to contacts 21 of test fixture 20. Referring to FIG. 2, this can be accomplished by simply reversing the top and bottom surfaces of printed circuit board 10, changing its direction or orientation so that contacts 13 can be connected to contacts 21. In other words, printed circuit board 10 is rotated such that contacts 13 are directly opposite contacts 21.

As can be appreciated by those skilled in the art, switching between a load capacitance configuration and a direct coupling configuration does not require oscillator 31 to be disconnected or additional pressing actions. Instead, the present connected contacts (either contacts 12 or 13) of printed circuit board 10 are disconnected from contacts 21 of test fixture 20; printed circuit board 10 is rotated or re-orientated so that the desired contacts face contacts 21; and the desired contact is then connected to contacts 21.

Figure 1:
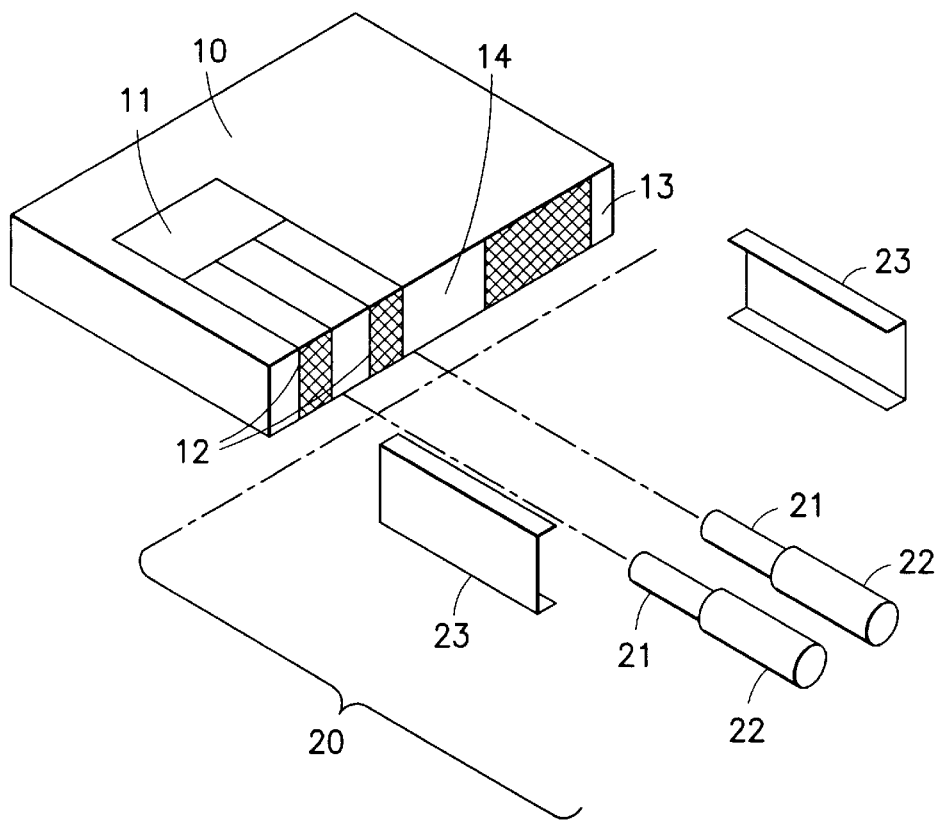
FIG. 1 illustrates the construction of a first embodiment of the present invention.

FIG. 1 illustrates an overview of a construction of the circuit diagram of FIG. 2. Printed circuit board 10 includes two contacts 12 and one contact 13, located on an edge 14. Load capacitance 11 is connected to contacts 12 by a conductor pattern.

Contacts 21 are held with sleeves 22 to provide flexibility in the axial direction. Contacts 21 and sleeves 22 form a unit, commonly referred to as a "pogo-pin". Although not shown in FIG. 1, sleeves 22 are attached to the main body of test fixture 20.

Guides 23 are provided for attaching printed circuit board 10 to main body of test fixture 20. Guides 23 prevent slippage in the direction perpendicular to the direction in which printed circuit board 10 is attached and the printed circuit board 10 from coming apart. The guide construction is not shown in FIG. 1 and will not be described in further detail because it is not pertinent to the present invention.

As described above, printed circuit board 10 can be connected to test fixture 20 to provide either a load capacitance configuration or a direct coupling configuration. A load capacitance may be connected to a circuit element to be measured, i.e., oscillator 31, by inserting printed circuit board 10 along guides 23 such that contacts 21 touch contacts 12 (which are coupled to load capacitance 11). In the alternative, if printed circuit board 10 is turned upside down and inserted, contacts 21 touch contact 13, thereby forming a short circuit between two contacts 21 (i.e., a direct coupling configuration).

If the center of two contacts 12 and the center of contact 13 are symmetric with respect to the central axis along which printed circuit board 10 is inserted, it is possible to switch between contacts 12 or contacts 13 by turning printed circuit board 10 upside down (i.e., rotating the printed circuit board 180 degrees around a central axis). In this way, by turning printed circuit board 10 upside down before insertion, it is possible to either set up a load capacitance configuration (via contacts 12) or a direct coupling configuration (via contact 13).

While FIG. 1 illustrates an example wherein the conductor pattern of printed circuit board 10 forms the contacts of printed circuit board 10, other contacts (not conductor patterns) may also be utilized. Contact 13 may also be split into two contacts, with a conductor pattern connected between the two contacts. In addition, while the above example shows contacts 12, 13 located on edge 14 of printed circuit board 10, contacts 12, 13 may also be placed on the pattern side.

Note that the present invention may be realized by placing contacts 12 and 13 on different edges respectively, and by changing the direction in which printed circuit board 10 is inserted, or the orientation of printed circuit board 10. However, as shown in FIG. 1, it is preferred that contacts 12, 13 are mounted on the same edge so that only one edge needs to be manually manipulated for attachment or removal.

Figure 3:
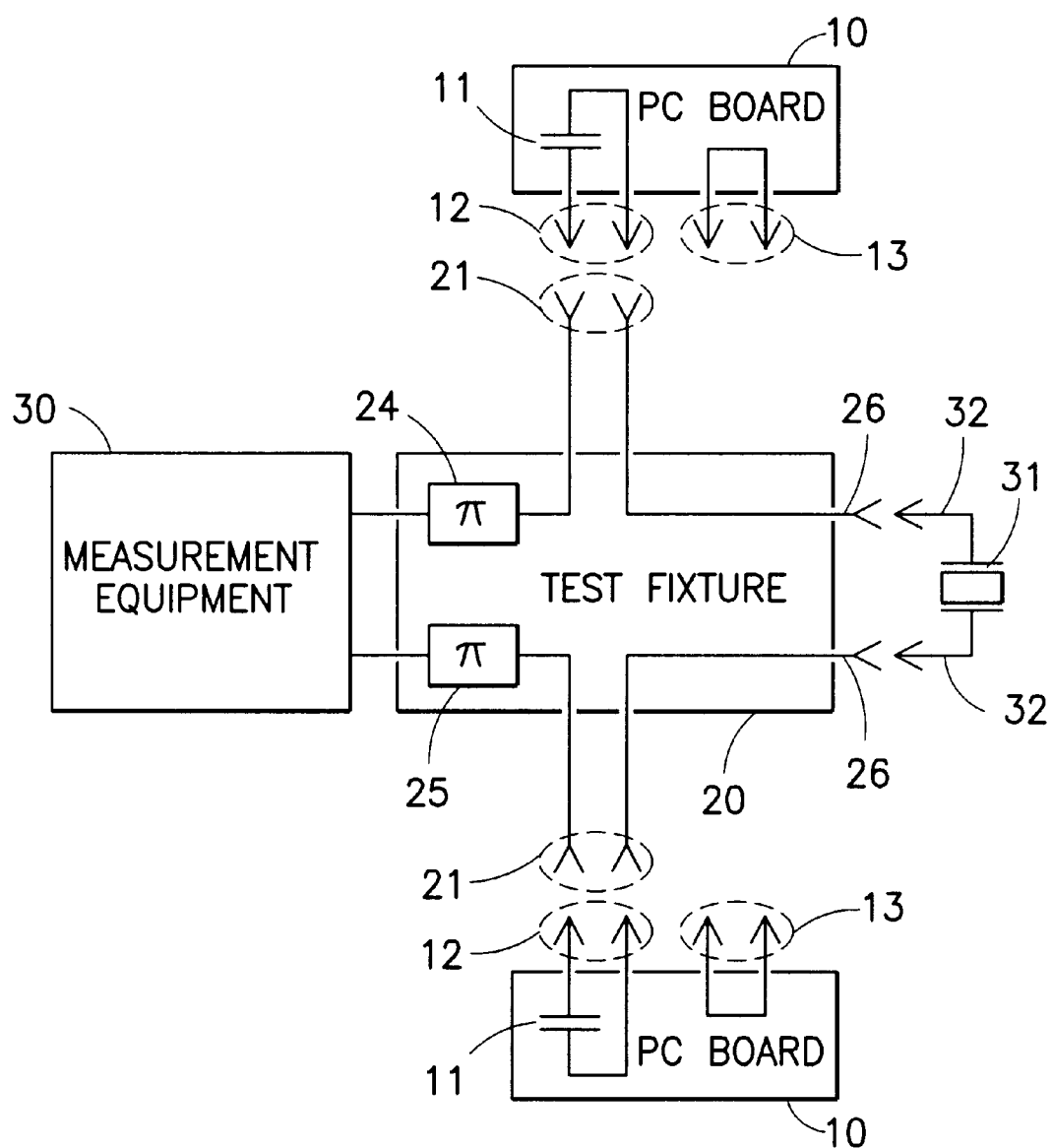
FIG. 3 illustrates a circuit design for a second embodiment of the present invention.

Referring to FIG. 3, a second embodiment of the invention employs test fixture that is capable of interconnection with more than one printed circuit board 10. Instead of having one set of contacts 21 as shown in FIG. 2, the main body of test fixture 20 (FIG. 3) includes two sets of contacts 21 which allow two printed circuit boards 10 to be connected on either side of oscillator 31. The load capacitance can thus be inserted on either side of the terminals of oscillator 31, in order to measure oscillator 31 of the surface mounted type.

In summary, the present invention improves the operability of the measurement circuit by simplifying the switching operation between a load capacitance configuration and a direct coupling configuration, and making the exchanging of the oscillator to be tested independent of the load capacitance. The present invention also can be implemented with smaller sized, low cost equipment, as compared to the prior art method that utilizes a switch in order to switch between the load capacitance and direct coupling configurations.

The invention having thus described with particular reference to the preferred forms thereof, it will be obvious that various changes and modifications may be made therein without departing from the spirit and scope of the invention as defined in the appended claims.

I claim:

1. Test fixture for measuring properties of a circuit element comprising:

element connection means for connecting said circuit element to be tested; and board connection means for connecting a circuit on a circuit board to said circuit element;

wherein said circuit element and said circuit board can be attached or removed from said test fixture independently of each other, said circuit board containing multiple independent circuits having contact points for connecting to said board connection means, each of said multiple independent circuits being individually connectable to said board connection means and said circuit element to be tested, based on an orientation of said circuit board.

2. Test fixture as recited in claim 1, wherein said circuit element to be tested is an oscillator employing a quartz oscillating element and said multiple independent circuits include a load capacitance circuit and a direct coupling circuit.

3. Test fixture as recited in claim 1, wherein said circuit board is attachable to said board connection means with at least two orientations, one orientation being a reversal of position of a second orientation.

4. Test fixture as recited in claim 1, wherein respective contact points of said multiple independent circuits are symmetrically arranged around a central axis of said circuit board in a direction in which said circuit board is connected to said board connection means.

5. Test fixture as recited in claim 1, wherein each respective contact point of said multiple independent circuits are symmetrically positioned around a point at a center of a top surface of said circuit board.

6. Test fixture apparatus, comprising:

test circuitry for generating test signals;

a device to be tested;

connector means including plural contacts for connecting said test circuitry to said device to be tested; and a connection board pluggably connectable to said contacts, said connection board pluggable to said contacts in a first configuration to insert a capacitance between said contacts, and pluggable to said contacts in a second configuration to insert a short circuit between said contacts.

7. The test fixture apparatus as recited in claim 6, wherein said first configuration and said second configuration require a reversal of said connection board interconnection with said contacts to accomplish a switching between said first configuration and said second configuration and vice versa.

* * * * *